(12) United States Patent
Ma et al.

(10) Patent No.: US 12,149,847 B2
(45) Date of Patent: Nov. 19, 2024

(54) IMAGE SENSOR HAVING COLUMN-LEVEL CORRELATED-DOUBLE-SAMPLING CHARGE TRANSFER AMPLIFIER

(71) Applicant: Gigajot Technology, Inc., Pasadena, CA (US)

(72) Inventors: Jiaju Ma, Monrovia, CA (US); Saleh Masoodian, Monrovia, CA (US)

(73) Assignee: Gigajot Technology, Inc., Pasadena, CA (US)

(*) Notice: Subject to any disclaimer, the term of this patent is extended or adjusted under 35 U.S.C. 154(b) by 0 days.

(21) Appl. No.: 18/058,722

(22) Filed: Nov. 23, 2022

(65) Prior Publication Data

US 2023/0209223 A1 Jun. 29, 2023

Related U.S. Application Data

(63) Continuation of application No. 17/058,535, filed as application No. PCT/US2019/034038 on May 24, 2019, now Pat. No. 11,516,422.

(Continued)

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14612* (2013.01); *H04N 25/59* (2023.01);
(Continued)

(58) Field of Classification Search
None
See application file for complete search history.

(56) References Cited

U.S. PATENT DOCUMENTS 6,423,961 B1 7/2002 Niederkorn et al.
2002/0105012 A1 8/2002 Hua
(Continued)

FOREIGN PATENT DOCUMENTS

CN 107112334 8/2017
WO 2017/160336 9/2017

OTHER PUBLICATIONS

International Search Report and Written Opinion mailed on Aug. 15, 2019 in corresponding International Application No. PCT/US2019/034038.

*Primary Examiner* — Quan Pham
(74) *Attorney, Agent, or Firm* — Robert C. Kowert; Kowert, Hood, Munyon, Rankin & Goetzel, P.C.

(57) ABSTRACT

Correlated double sampling column-level readout of an image sensor pixel (e.g., a CMOS image sensor) may be provided by a charge transfer amplifier that is configured and operated to itself provide for both correlated-double-sampling and amplification of floating diffusion potentials read out from the pixel onto a column bus after reset of the floating diffusion (i) but before transferring photocharge to the floating diffusion (the reset potential) and (ii) after transferring photocharge to the floating diffusion (the transfer potential). A common capacitor of the charge transfer amplifier may sample both the reset potential and the transfer potential such that a change in potential (and corresponding charge change) on the capacitor represents the difference between the transfer potential and reset potential, and the magnitude of this change is amplified by the charge change being transferred between the common capacitor and a second capacitor selectively coupled to the common capacitor.

20 Claims, 17 Drawing Sheets

Related U.S. Application Data

(60) Provisional application No. 62/676,266, filed on May 24, 2018.

(51) Int. Cl.
    *H04N 25/59*          (2023.01)
    *H04N 25/616*        (2023.01)
    *H04N 25/65*          (2023.01)
    *H04N 25/778*        (2023.01)

(52) U.S. Cl.
    CPC ........... *H04N 25/616* (2023.01); *H04N 25/65* (2023.01); *H04N 25/778* (2023.01)

(56) References Cited

U.S. PATENT DOCUMENTS

| | | | |
|---|---|---|---|
| 2005/0051701 A1* | 3/2005 | Hong | H04N 25/575 250/214.1 |
| 2005/0168602 A1 | 8/2005 | Sumi et al. | |
| 2007/0165117 A1 | 7/2007 | Toya et al. | |
| 2011/0018037 A1* | 1/2011 | Ohri | H01L 27/14612 257/E27.15 |
| 2011/0069191 A1* | 3/2011 | Jung | H04N 25/76 327/155 |
| 2015/0102206 A1 | 4/2015 | Borremans | |
| 2018/0115727 A1 | 4/2018 | Yanagita et al. | |
| 2018/0227516 A1 | 8/2018 | Mo et al. | |

\* cited by examiner

Cross-section along cut-line aa'

Cross-section along cut-line aa'

IMAGE SENSOR HAVING COLUMN-LEVEL CORRELATED-DOUBLE-SAMPLING CHARGE TRANSFER AMPLIFIER

RELATED APPLICATIONS

This application is a continuation of U.S. application Ser. No. 17/058,535, filed Nov. 24, 2020, which is a 371 of PCT Application No. PCT/US2019,034038, filed May 24, 2019, claims the benefit of U.S. Provisional Application No. 62/676,666, filed May 24, 2018, which are hereby incorporated herein by reference in their entirety.

STATEMENT REGARDING FEDERALLY SPONSORED RESEARCH OR DEVELOPMENT

This invention was made with government support under grant/contract number 1747016 awarded by the National Science Foundation. The government has certain rights in the invention.

BACKGROUND

Some aspects of the present disclosure relate to providing low-noise and/or high-speed image sensors, some embodiments of such image sensors being well-suited for myriad applications, including, for example, photon-counting image sensors, low-noise image sensors for low-light photography, high dynamic range imaging, high-speed imaging applications, 3D sensing and imaging, and/or Quanta Image Sensors.

FIG. 1 schematically depicts an illustrative conventional back-side-illuminated (BSI) 4-Transistor (4T) CMOS image sensor pixel that includes a pinned photodiode (PPD), a transfer gate (TG) formed on a gate insulator 11 (e.g., an oxide), a reset transistor comprising (i) a drain coupled to voltage supply VDD and (ii) a reset gate (RG) and, a source follower (SF) transistor, and a row select transistor having a row-select gate RS. More specifically, this illustrative typical pinned photodiode 4T pixel includes the following doped regions: (i) p substrate 1; (ii) n− deep photoelectron storage well (SW) 2; (iii) p+ back-surface passivation layer 3; (iv) n shallow photoelectron storage well (SW) 4; (v) p+ surface pinning layer 5; (vi) p transfer gate (TG) threshold voltage adjustment layer 6; (vii) n floating diffusion (FD) extension region 7; and (viii) n+ floating diffusion (FD) region 8. As understood by those skilled in the art, the PPD comprises pinning layer 5 and SWs 2 and 4, the floating diffusion (FD) comprises FD regions 7 and 8, and the reset, row-select, and source-follower transistors depicted by circuit symbols are also formed in/on the depicted semiconductor substrate.

Correlated double sampling (CDS) is essentially always used in mainstream CMOS image sensors to eliminate the kTC reset noise on the FD node. A process of one pixel readout cycle implementing CDS includes the following steps, in order as enumerated: (1) resetting the FD by pulsing the reset gate (RG); (2) sampling or reading the voltage on the FD after reset (sometimes referred to as the "reset sample"); (3) transferring the photoelectrons from the storage well (SW) to the FD by pulsing TG; (4) sampling or reading the voltage on the FD after the charge transfer (sometimes referred to as the "signal sample"); and (5) generating a signal equal to the difference between the two samples (sometimes referred to as the "output signal" or "pixel output signal"). The CDS process may be performed in either the analog or digital domain, and it can effectively eliminate the reset noise. It cannot, however, completely cancel 1/f noise (flicker noise) and random telegraph noise (RTN) generated in the in-pixel SF.

The 1/f noise and RTN are considered the major noise sources in low-noise CMOS image sensors. The RTN is caused by the capture/emission of carriers by the Si—SiO2 interface traps in the SFs. If a trap switches its state (empty/occupied) between the two CDS samples, RTN will be added to the output signal because of the change in the threshold voltage, transistor surface potential, etc. The 1/f noise may be caused by the interface traps and the phonon scattering in the SF transistors; it appears as higher magnitude in the low-frequency regime and lower magnitude in the high-frequency regime.

Both RTN and 1/f noise can be effectively reduced with shorter time between the two CDS samples. For RTN, the chance for traps to switch states is reduced in a shorter time period. For 1/f noise, a shorter CDS time can filter out more low-frequency noise components and reduce the total noise. The relationship between CDS time and SF noise (RTN+1/f) has been demonstrated experimentally. By way of example, FIG. 2 shows the measured SF RMS noise for different CDS times. Effective noise reduction can be observed with shorter CDS time (i.e., time between the two CDS samples), especially when the CDS time becomes shorter than 1 μsec.

The reduction of CDS time is limited by the time required for the charge transfer process, which includes (1) the time needed for the photoelectrons to move into the FD, and (2) the time for the FD voltage to settle to the new voltage level. Process (1) typically requires less than 50 nsec, but process (2) sometimes can take more than 1 μsec. The time required for process (2) is determined by the following: (1) the size of the SF load capacitance $C_L$; (2) the SF bias current $i_B$; and (3) the total voltage difference on the FD at the end of the charge transfer process, $\Delta V_{FD}$. The required settling time is given by: $\Delta t = \Delta V_{FD} \, C_L / i_B$.

The total voltage difference on the FD includes two parts: (1) the voltage change caused by the transferred charge, $\Delta V_C = Q/C_{FD}$, where Q is the total charge of the transferred photoelectrons, and $C_{FD}$ is the effective capacitance of the FD node; and (2) the voltage change ($\Delta V_{FT}$) from the capacitive coupling induced by the TG pulse, called feed-through voltage.

The impact of the feed-through voltage may be further understood with reference to FIGS. 3A and 3B, which illustrate a model of the TG-FD overlap capacitance in a PPD pixel along with an equivalent capacitance on the FD node, $C'_{FD}$, which is the FD's effective capacitance ($C_{FD}$) exclusive of the TG-FD overlap capacitance; namely:

$$C'_{FD} = C_{FD} - C_{TG\text{-}FD}$$

That is, in this model, the TG-FD overlap capacitance is part of the effective capacitance of the FD for purposes of determining the FD voltage change caused by charge transfer to the FD, but is not part of the effective capacitance of the FD for purposes of determining the FD voltage change caused by the TG pulse being capacitively coupled to the FD. (By way of example for purposes of additional clarity, in a typical 4T pixel, the FD total effective capacitance ($C_{FD}$) includes the following components: (1) the diffusion capacitance of the FD; (2) the diffusion capacitance of the source of the reset transistor, if the FD is connected to the reset transistors by a wire/interconnect; (3) the effective gate capacitance of the source follower; (4) the overlap capacitance between the RG and the FD; and (5) the overlap capacitance between the TG and the FD; (6) the inter-metal parasitic capacitance.)

Accordingly, as may be appreciated from the model depicted in FIG. 3, the FD voltage change corresponding to the feed-through voltage caused by capacitive coupling when the TG is pulsed is given by:

$$\Delta V_{FT} = \Delta V_{TG} C_{TG\text{-}FD} / (C_{TG\text{-}FD} + C'_{FD}) = \Delta V_{TG} C_{TG\text{-}FD} / C_{FD}$$

where $\Delta V_{TG}$ is the voltage change on the TG, $C_{FD}$ is the FD total effective capacitance, and $C_{TG\text{-}FD}$ is the TG-FD overlap capacitance. At the end of the charge transfer, the TG voltage changes from the high voltage to the low voltage, and $\Delta V_{TG}$ is typically higher than about 2.5V. Depending on the capacitance ratio [i.e., $C_{TG\text{-}FD}/C_{FD}$], the feed-through voltage can be as high as, e.g., 0.8V, and possibly even greater.

In view of the present disclosure, therefore, it will be understood that in many implementations the feed-through voltage $\Delta V_{FT}$ may dominate the total voltage change on the FD, and thus limit the minimum required settling time. For instance, in low-light imaging and/or photon-counting imaging applications, the signal generated by the photo-electron(s) is weak; that is, the voltage change induced by the charge transfer ($\Delta V_C$) is usually very small, typically much less than the voltage change induced by the feed-through voltage ($\Delta V_{FT}$). Yet reducing readout noise is of significant (if not paramount) concern in such low-light imaging and/or photon-counting applications. But by limiting the shortest required settling time, the feed-through voltage effectively increases—and precludes reducing—the readout noise (e.g., the 1/f noise and/or the RTN).

SUMMARY OF SOME ILLUSTRATIVE EMBODIMENTS

The present disclosure describes various illustrative embodiments of in-pixel as well as column-level improvements to the readout chain of a CMOS image sensor. While such in-pixel and column-level improvements may be advantageously implemented together, it will be understood in view of the present disclosure that in various embodiments they may be implemented independently.

In accordance with some embodiments, a low-noise, high-conversion-gain CMOS image sensor pixel is provided by including a doped pinning region within, adjacent, and/or near a floating diffusion of the pixel to reduce or eliminate the effective capacitive coupling between the floating diffusion and a transfer gate that is configured to control the potential between a photocharge accumulation region of the pixel and the floating diffusion so as to control charge (e.g., photocharge) transfer from the photocharge accumulation region to the floating diffusion along a charge transfer path. In some embodiments, the doped pinning region is disposed adjacent to, and may be overlapped by, an edge of the transfer gate stack, so as to effectively pin the potential at a surface region of the semiconductor at one end of the transfer gate such that the charge transfer path having a potential controlled by the transfer gate is disposed away from the surface region, thereby providing a pinned transfer gate. Accordingly, in accordance with some embodiments, a CMOS image sensor pixel comprises a pinned transfer gate and a buried charge transfer path to (1) reduce the overlap parasitic capacitance between the transfer gate and floating diffusion for high conversion gain; and (2) reduce the voltage feed-through on the floating diffusion caused by transfer gate signal pulses for fast correlated double sampling and low-noise readout.

In accordance with some embodiments of the present disclosure, the doped pinning region within the floating diffusion forms a diode with the surrounding region of the floating diffusion. In some embodiments, the floating diffusion may include a first doping region of a first dopant type (e.g., n) formed at a first depth, and a second doping region of the first type formed within the first doping region at a second depth less than the first depth, and the doped pinning region is formed at least partially within the first doping region and not within the second doping region and has a doping type opposite to that of the first dopant type and a depth less than the first depth. For example, the first and second doping regions may be doped n and n+, respectively, and the doped pinning region may be doped p+. A portion of the doped pinning region may extend laterally outside of the floating diffusion region into a portion of the substrate having the same doping type as the pinning region and being conductively coupled to a pinning potential.

In accordance with some embodiments, as an alternative or an addition to implementing a pinned transfer gate, a pinned reset gate may be implemented such that a doped pinning region is included within the floating diffusion of the pixel to reduce or eliminate the effective capacitive coupling between the floating diffusion and a reset gate that is configured to control the potential between the floating diffusion and a drain region so as to control charge transfer from the floating diffusion to the drain region along charge transfer path and thereby selectively reset the potential of the floating diffusion. In some embodiments, the doped pinning region is disposed adjacent to, and may be overlapped by, an edge of the reset gate stack, so as to effectively pin the potential at a surface region of the semiconductor at one end of the reset gate such that the charge transfer path having a potential controlled by the reset gate is disposed away from the surface region, thereby providing the pinned reset gate. Accordingly, in accordance with some embodiments, a CMOS image sensor pixel comprises a pinned reset gate and a buried charge transfer path to (1) reduce the overlap parasitic capacitance between the reset gate and floating diffusion for high conversion gain; and (2) reduce the voltage feed-through on the floating diffusion caused by reset gate signal pulses for fast correlated double sampling and low-noise readout.

It will be understood in view of the present disclosure that in some embodiments implementing both a pinned transfer gate and a pinned reset gate, the pinned transfer gate and the pinned reset gate may be configured with respective doped pinning region portions formed within the floating diffusion, or alternatively may be configured with a common doped pinning region portion (i.e., use for both the pinned transfer gate and the pinned reset gate) formed within the floating diffusion.

In addition, some aspects of the present disclosure relate to providing low-noise and fast correlated-double-sampling column-level readout of an image sensor pixel (e.g., a CMOS image sensor). In accordance with some embodiments, a charge transfer amplifier is configured and operated to itself provide for both correlated-double-sampling and amplification of the floating diffusion potentials read out from the pixel onto a column bus after reset of the floating diffusion (i) but before transferring photocharge to the floating diffusion (referred to herein as the reset potential) and (ii) after transferring photocharge to the floating diffusion (referred to herein as the transfer potential). In some embodiments, a common capacitor of the charge transfer amplifier samples both the reset potential and the transfer potential such that a change in potential (and corresponding charge change) on the capacitor represents the difference between the transfer potential and reset potential, and the magnitude of this change is amplified by the charge change being transferred between the common capacitor and a second capacitor selectively coupled to the common capacitor. In various embodiments, the column bus may be directly or capacitively coupled to the input of the charge transfer amplifier.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

DETAILED DESCRIPTION OF SOME ILLUSTRATIVE EMBODIMENTS

Figure 1:
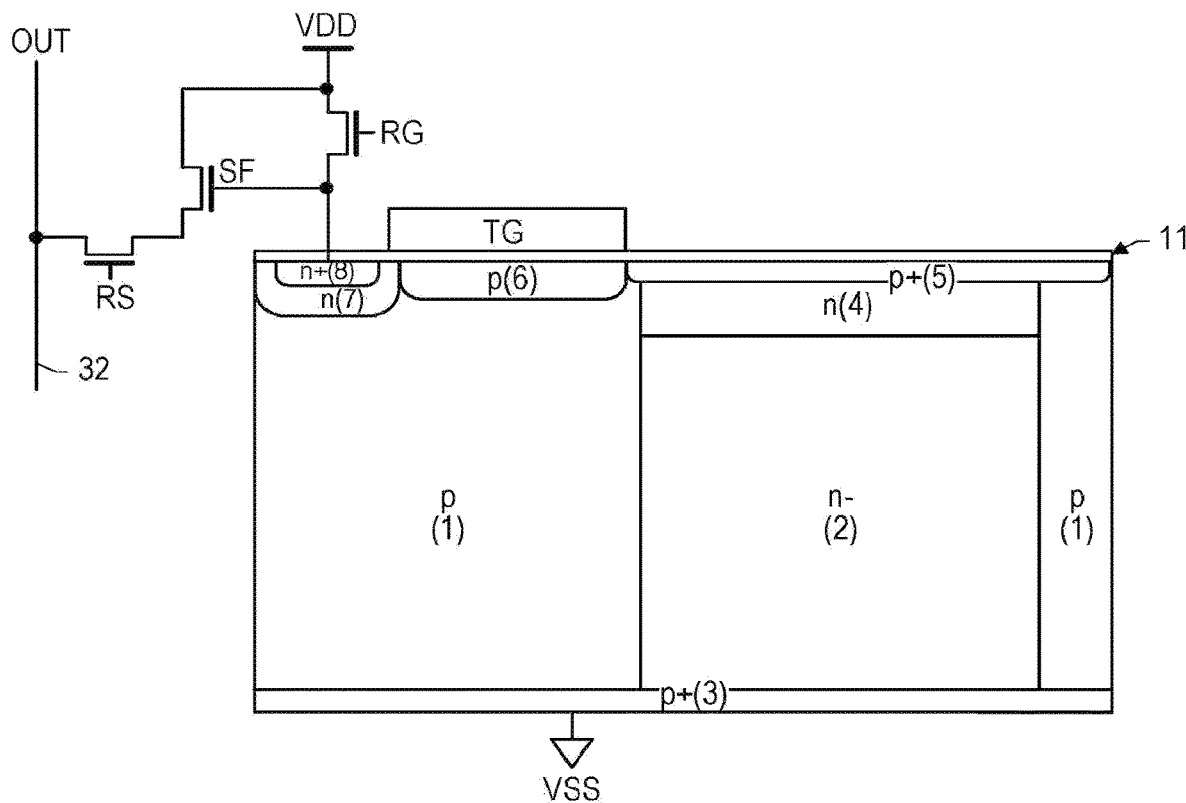
FIG. 1 schematically depicts an illustrative conventional back-side-illuminated (BSI) 4-Transistor (4T) CMOS image sensor pixel.
Figure 2:
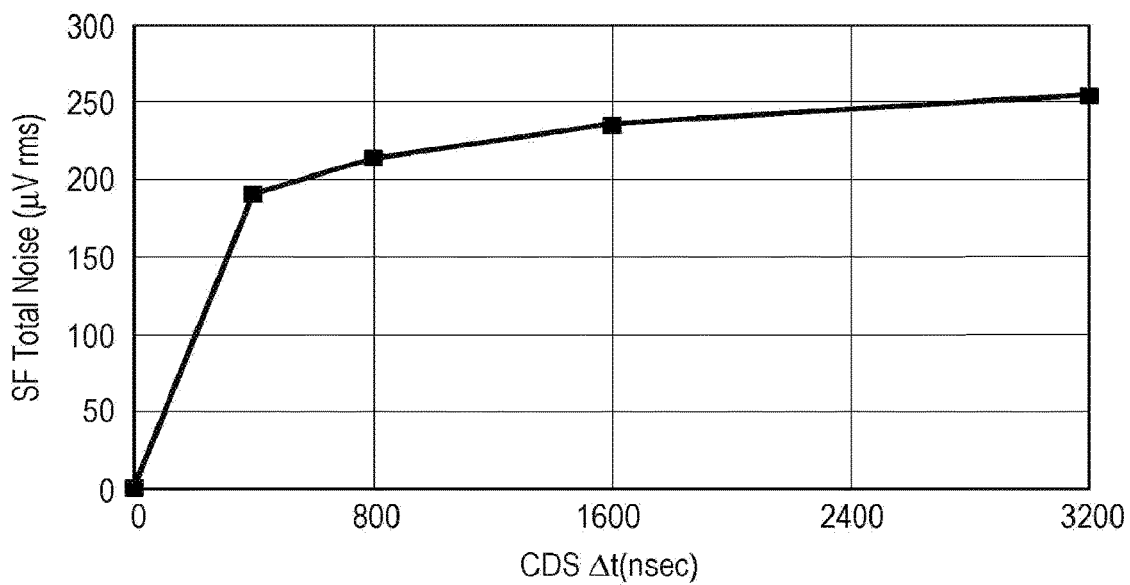
FIG. 2 shows source-follower (SF) RMS noise measured for different correlated-double-sampling (CDS) times.
Figures 3A, 3B:
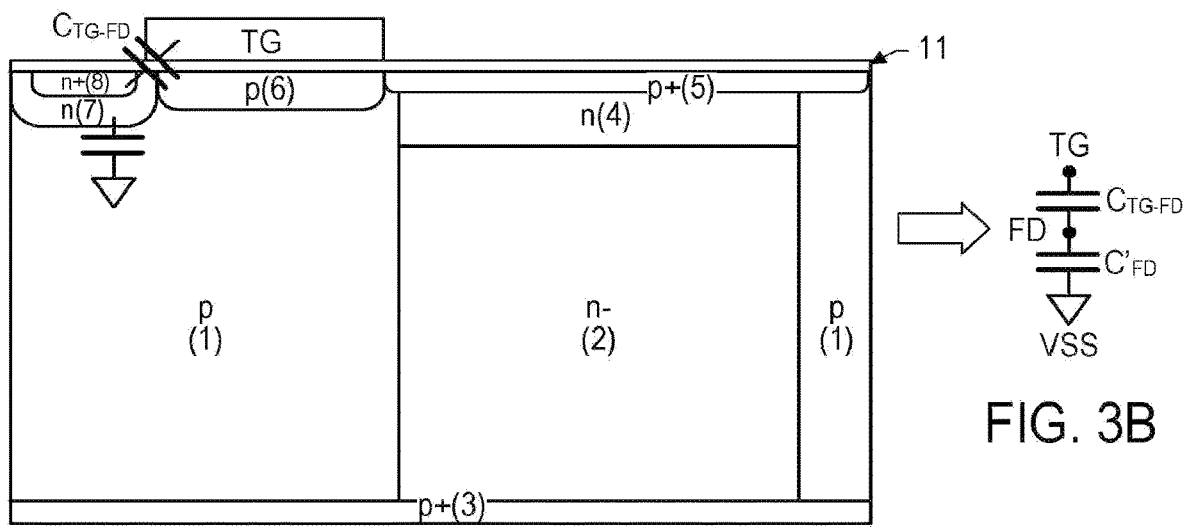
FIG. 3A illustrates a cross-sectional view of a portion of a CMOS image sensor pinned photodiode (PPD) pixel, including a depiction of capacitances accounted for in a model of the TG-FD overlap capacitance for the PPD pixel.
FIG. 3B illustrates a model of the TG-FD overlap capacitance corresponding to a PPD pixel of FIG. 3A.

Throughout the description and claims, the following terms take at least the meanings explicitly associated herein, unless the context dictates otherwise. The meanings identified below do not necessarily limit the terms, but merely provide illustrative examples for the terms.

The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

Also, as used herein, "n and "p" designations (e.g., as in "n-type," "p-type," "n-well," etc.) are used in ordinary and customary manner to designate donor and acceptor type impurities that promote electron and hole carriers, respectively, as majority carriers. The term "substrate" is to be understood as a semiconductor-based material such as silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrates" in the following description, previous process steps may have been utilized to form regions or junctions in the base semiconductor structure or foundation. In addition, the semiconductor need not be silicon-based, but may be based on, for example, silicon-germanium, germanium, or gallium arsenide.

In addition, as used herein, unless the context clearly dictates otherwise, the term "coupled" refers to directly connected or to indirectly connected through one or more intermediate components and, in some contexts, may also denote or include electrically coupled, such as conductively coupled, capacitively coupled, and/or inductively coupled. Further, "conductively coupled" refers to being coupled via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., control line) said to be coupled to the gate of a transistor may refer to the conductor being operable to control the gate potential so as to control the operation of the transistor (e.g., switching the transistor between "on" and "off" states), regardless of whether the conductor is connected to the gate indirectly (e.g., via another transistor, etc.) and/or directly.

Further, as used herein with respect to a semiconductor substrate, the term "lateral" refers to one or more directions in a plane that is parallel (or substantially parallel) to a surface plane of the semiconductor substrate. In addition, it will be understood that simply for ease of reference and clarity of exposition with respect to describing devices formed in a semiconductor substrate or, similarly, with respect to describing the fabrication of such devices, terms such as "upper," "top," "lower," "bottom," "overlying," "underlying," "above," "below," "frontside," and "backside," and the like, with reference to a layer, junction, doped region, or other structure refers to a relative spatial position with respect to a cross-sectional perspective of perpendicular to the semiconductor substrate and does not denote a preferred or required orientation. In this regard, the "top" surface of the substrate as used herein typically refers to a surface on, in, or through which devices are primarily formed (e.g., surface on which transistor gate stacks are formed), unless the context dictates otherwise. It is understood, therefore, as noted, that terminology such as "top," "upper," "bottom," "lower," and the like, as used herein is a convention simply for convenience and ease of reference with respect to referring to different layers, and does not otherwise impart any limitation on the overall design and/or orientation of an image sensor or pixel in accordance with the present disclosure.

In this regard, for ease of reference, as used herein, two layers, regions, or other structures/elements may be referred to as being "adjacent" if they do not include one or more intervening layers, regions (e.g., doped regions), or other structures/elements. In other words, two layers, regions, or other structures/elements referred to spatially (e.g., "on," "above," "overlying," "below," "underlying," "laterally," etc.) with respect to each other may have one or more intervening layers, regions, or other structures/elements; however, use of the term "adjacent" (or, similarly, "directly," such as "directly on," "directly overlying," and the like) denotes that no intervening layers, regions, or other structures/elements are present.

Those skilled in the art will also understand that, as may be used herein, the term "charge storage node" or "charge storage region" in the context of an image sensor pixel may refer to a node or region, such as a floating diffusion, to which photocharge (i.e., charge generated in the pixel by photoconversion of photons incident on the pixel) may be selectively transferred under control of one or more gates (e.g., a transfer gate) from a region (referred to herein as a photocharge accumulation region) in which the photocharge accumulates upon being generated by photoconversion of incident photons, and/or from another charge storage node/ region.

Those skilled in the art will also understand that, as may be used herein, the term "storage well" may be used interchangeably with "photocharge accumulation region," unless the context clearly dictates otherwise. In addition, those skilled in the art will understand that, as may be used herein, a "photoconversion device" in the context of an image sensor pixel may refer to a portion of the pixel configured for converting one or more photons incident on the pixel into charge (e.g., electrons). A photoconversion device may also include a region (which may be referred to herein as a "storage well" or "photocharge accumulation region") in which the generated charge (referred to as "photocharge") is stored/accumulated upon being generated, prior to any in-pixel charge transfer and/or pixel readout operations. In some embodiments, a photoconversion device may be implemented as comprising a pinned photodiode (PPD) structure.

Some embodiments provide a CMOS image sensor pixel that effectively reduces the capacitive coupling between FD and TG, hence significantly reducing the feedthrough voltage, and thus enabling shorter CDS time and critical noise reduction.

Figure 4A:
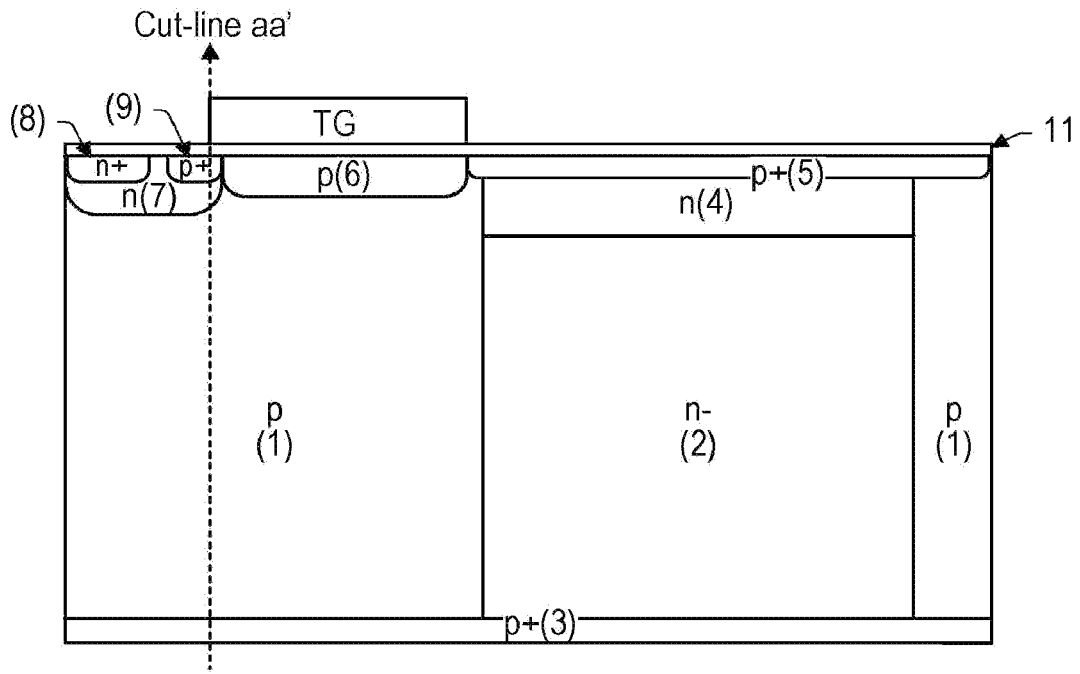
FIGS. 4A and 4B schematically depict cross-sectional views of a portion of a 4T PPD pixel of a CMOS image sensor, in accordance with some embodiments.
Figure 4B:
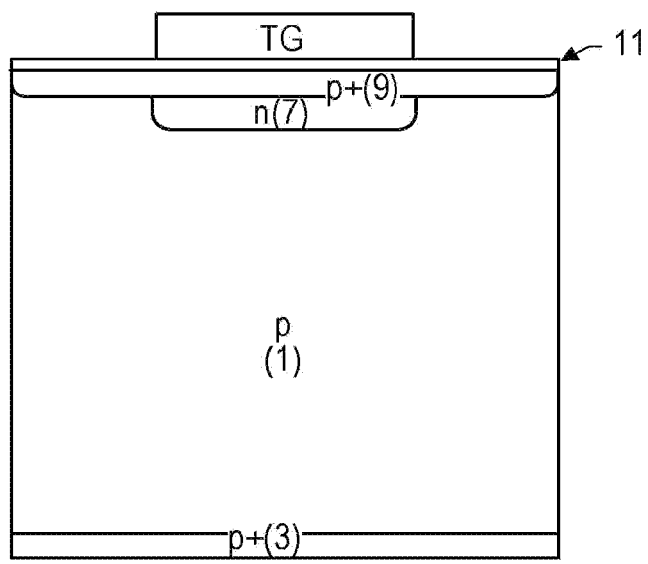

FIGS. 4A and 4B schematically depict cross-sectional views of a portion of a 4T PPD pixel of a CMOS image sensor in accordance with some embodiments according to the present disclosure. As FIGS. 4A and 4B illustrate some illustrative embodiments directed to reducing the capacitive coupling between FD and TG, for clarity FIGS. 4A and 4B focus primarily on the FD and TG portion of a pixel (also showing an illustrative PPD for additional clarity), and do not show other well-known pixel features, such as a reset transistor (or gateless reset device), source-follower transistor, and row-select transistor (such as those depicted in FIG. 1).

As shown, the illustrative embodiment comprises the following doped semiconductor regions: (i) p substrate 1; (ii) n− deep photoelectron storage well 2; (iii) p+ back-surface passivation layer 3; (iv) n shallow photoelectron storage well 4; (v) p+ surface pinning layer 5; (vi) p transfer gate threshold voltage adjustment layer 6; (vii) n floating diffusion extension region 7; (viii) n+ floating diffusion 8; and (ix) p+ floating diffusion isolation layer 9. The PPD comprises pinning layer 5 and SWs 2 and 4. The floating diffusion (FD) comprises FD regions 7 and 8, and p+ floating diffusion isolation layer 9 is disposed within FD region 8, forming a p-n junction therewith.

Accordingly, compared to the conventional PPD depicted in FIG. 1, this illustrative CMOS image sensor pixel according to some embodiments of the present disclosure has an extra p+ layer 9 near the edge of the TG (between the TG and the FD) to effectively isolate the FD from the TG. As shown in FIG. 4B, the p+ layer 9 is internally connected to the substrate and thus biased to the substrate potential ($V_{SS}$). The p+ doped region is configured (e.g., doping concentration, width) such that it will not be fully depleted when the transfer gate (TG) is pulsed.

Figures 5A, 5B:
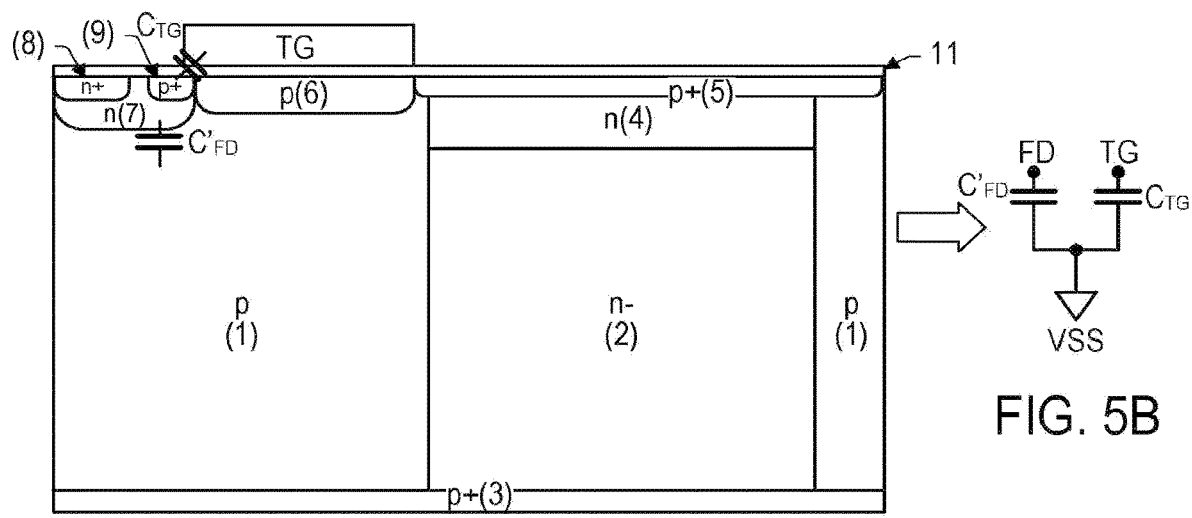
FIGS. 5A and 5B illustrate a capacitance model applicable to when TG is pulsed during the charge transfer process for the illustrative CMOS image sensor pixel of FIG. 4A, in accordance with some embodiments.

FIGS. 5A and 5B illustrate a capacitance model applicable to when TG is pulsed during the charge transfer process for this illustrative CMOS image sensor pixel embodiment having an isolated floating diffusion. In this model, the FD capacitance and the TG capacitance are separated by the VSS terminal. Accordingly, theoretically, the voltage change on the TG will not result in a feedthrough voltage on the FD. Practically, however, there may be still a small amount of residual TG-FD overlap capacitance (and corresponding feed-through), but the amount is significantly reduced compared to a conventional PPD pixel (which does not have an isolated floating diffusion), such as the conventional PPD pixel of FIG. 1.

Figure 6:
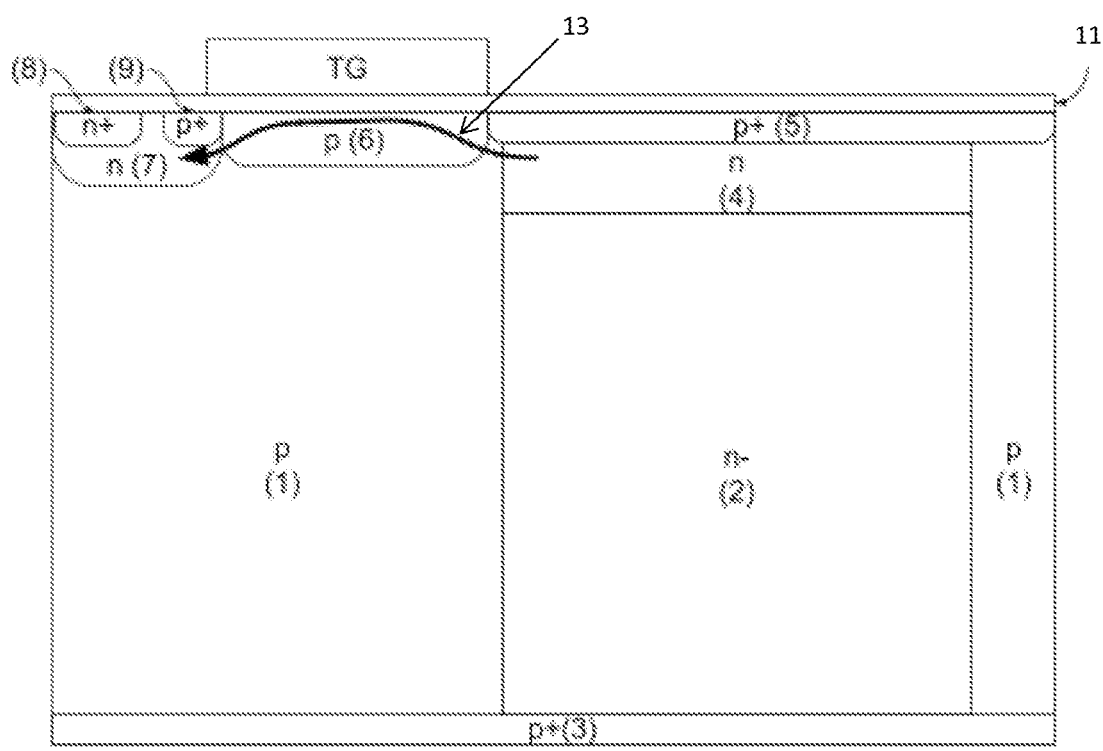
FIG. 6 schematically illustrates the charge transfer path in a PPD pixel of FIGS. 4A and 4B, in accordance with some embodiments.

During the charge transfer process, the n-type floating diffusion extension layer 7 bridges the charge transfer path underneath the TG and the FD, and the photoelectrons will flow to the FD through layer 7. The charge transfer path 13 is illustrated in FIG. 6. In other words, in this illustrative embodiment, floating-diffusion extension layer 7 is configured to extend under the pinned isolation layer 9 toward the TG channel region to increase the electrostatic potential in this extension layer region (eliminating the otherwise present electron energy barrier) and ensure that TG is operable to cause complete charge transfer from the PPD to the FD despite pinned p+ isolation layer 9 precluding lateral photocharge transfer from the TG channel region to the FD at or near the semiconductor surface.

In accordance with some embodiments, the pixel is configured (e.g., doping concentrations and thicknesses of n-extension layer 7, p+ isolation layer 9, TG threshold and pulse ON/OFF voltage levels, etc.) such that n-channel extension layer 7 is conductive when TG is pulse ON but is fully depleted when the TG is OFF (e.g., 0V or slightly negative bias), so as to preclude (e.g., eliminate or effectively render negligible) its contribution to the parasitic capacitance. hat it will not contribute to the parasitic capacitance.

In the illustrative embodiment of FIGS. 4A and 4B, at least insofar as the pinned p+ floating diffusion isolation layer 9 is disposed within and forms a p+/n junction with the surrounding n floating diffusion extension region, isolation layer 9 may be considered as being part of the FD structure (such as for ease of reference by, e.g., using the oxymoronic term "pinned-FD" to refer to such a configuration having the pinned isolation region disposed within the FD), even though layer 9 is not floating but pinned and is not a photocharge storage region but instead isolates the photocharge storage region.

In view of the present disclosure, those skilled in the art will understand that while the illustrative embodiment depicted in FIGS. 4A and 4B provides p+ isolation layer 9 entirely within floating diffusion extension region 7 (forming a p+/n junction therewith), in principle there are myriad alternative possible configurations for isolating a floating diffusion from an associated transfer gate (and/or from an associated reset gate, as further described herein below) by forming a pinned isolation region therebetween, and some such alternative possible configurations, for example, may not dispose the isolation layer entirely within a floating diffusion region. By way of non-limiting example, with reference to FIGS. 4A and 4B, in some alternative embodiments n+ floating diffusion 8 may be laterally spaced away from p+ isolation layer 9 by an intervening first p-type region rather than by the depicted intervening portion of the n-type extension region 7. And in some embodiments, the n-type extension region 7 may additionally be spaced away from p+ isolation layer 9 by the noted first p-type region.

Further, in view of the present disclosure and with reference to FIGS. 4A and 4B, those skilled in the art will understand that in various alternative embodiments the TG gate may overlap p+ isolation layer 9, or the TG gate stack edge that is disposed near p+ isolation layer 9 may align with or instead be laterally spaced away from the nearest lateral edge of p+ isolation layer 9.

In view of the present disclosure, it also will be understood by those skilled in the art that image sensor embodiments comprising an isolated FD structure (e.g., a structure comprising a floating diffusion region and a pinned region disposed between the floating diffusion region and a transistor gate configured to selectively transfer photocharge to the floating diffusion) are not limited to 4T PPD pixel designs such as the type depicted in FIG. 5. For example, some embodiments according to the present disclosure may implement an isolated FD structure (such as a pinned-FD structure) in a pixel employing a vertical photoelectron storage well, such as in the pixel structures disclosed U.S. Pat. No. 9,728,565 (which is hereby incorporated by reference herein in its entirety), to reduce the size of pixel and enlarge the fill factor for excellent low-light performance and Quanta Image Sensor (QIS) applications.

Figure 7A:
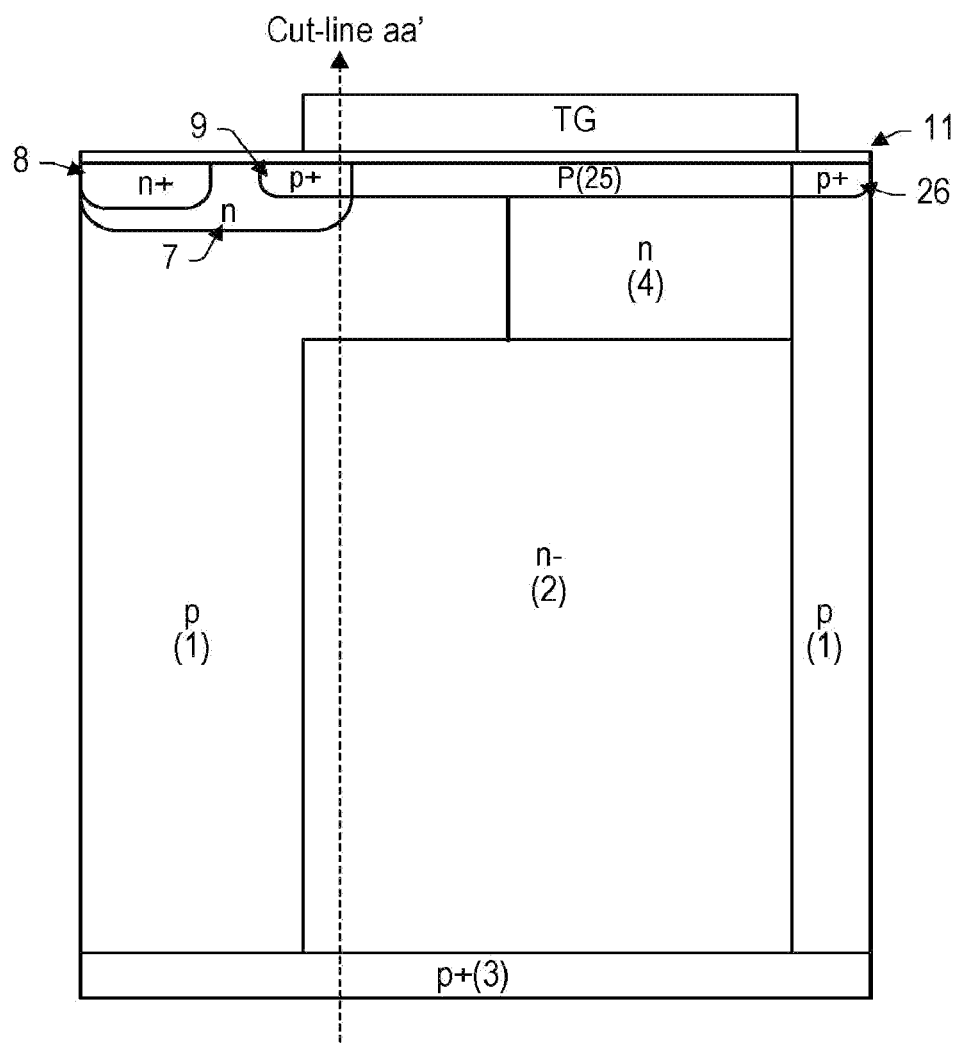
FIGS. 7A and 7B schematically depict cross-sectional views of the structures of a portion of an illustrative pixel having a vertical photoelectron storage well and an isolated floating diffusion, in accordance with some embodiments.
Figure 7B:
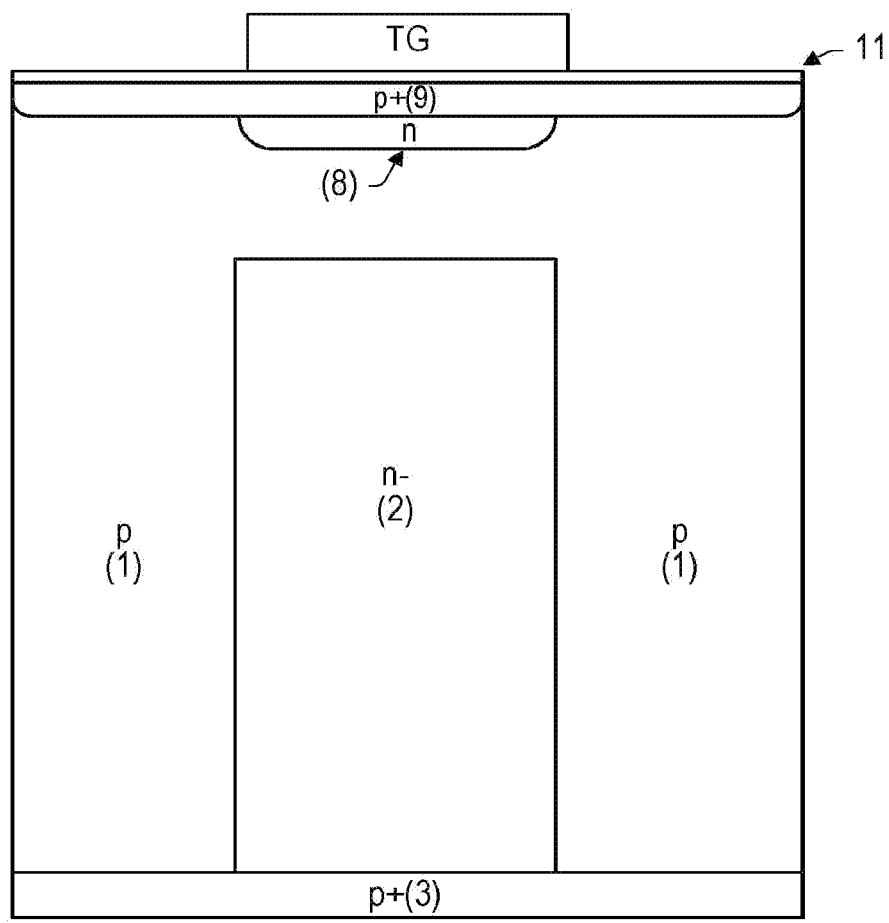
Figure 8:
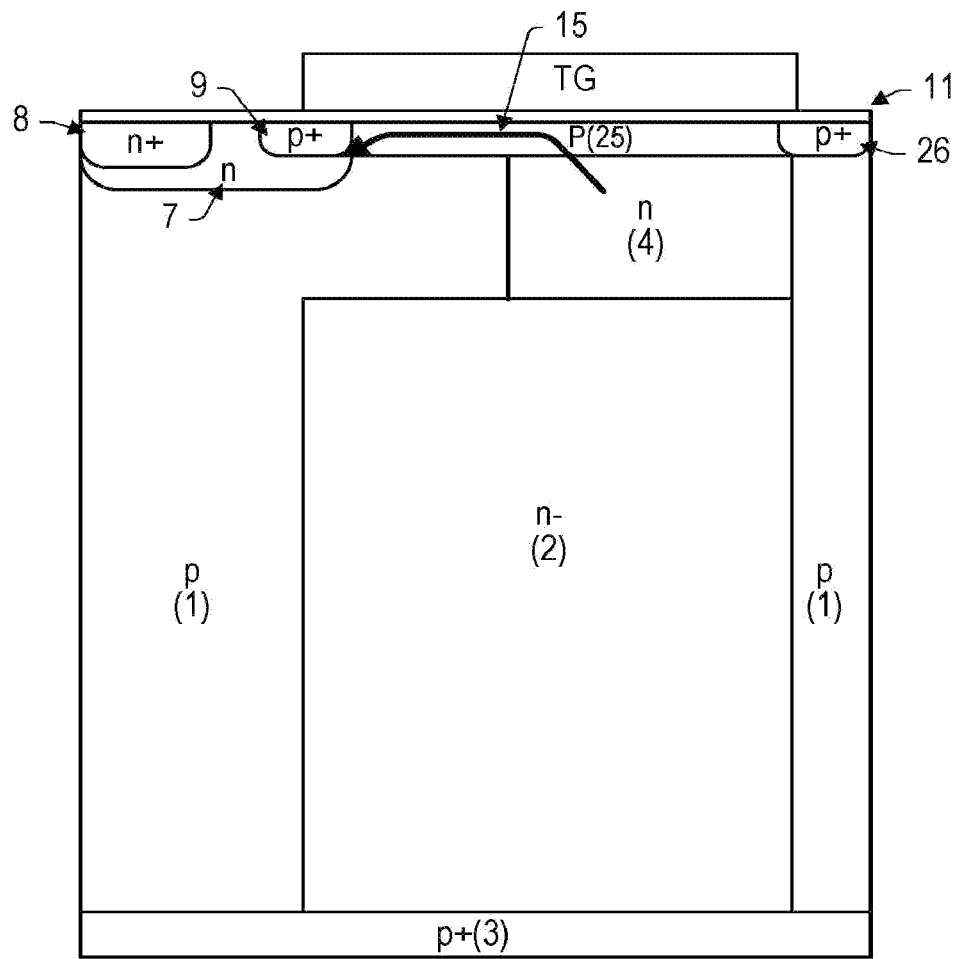
FIG. 8 schematically illustrates the charge transfer path in a PPD pixel of FIGS. 7A and 7B, in accordance with some embodiments.

FIGS. 7A and 7B schematically depict cross-sectional views of the structures of a portion of an illustrative pixel having a vertical photoelectron storage well and an isolated floating diffusion according to some embodiments of the present disclosure. This illustrative embodiment includes the following doped regions: (i) p substrate 1; (ii) n– deep photoelectron storage well 2; (iii) p+ back-surface passivation layer 3; (iv) n shallow photoelectron storage well 4; (v) p transfer gate threshold adjustment layer 25; (vi) p+ front surface passivation layer 26; (vii) n floating diffusion extension region 7; (viii) n+ floating diffusion 8; and (ix) p+ floating diffusion isolation region 9. The operation of this device is similar to the previously discussed device of FIGS. 4A and 4B, though the charge transfer path 15 is slightly different, as illustrated in FIG. 8.

The foregoing illustrative embodiments of image sensor pixels having an isolated floating diffusion to reduce the voltage overshoot in order to achieve shorter settling time and lower noise on the pixel output, and subsequently on the column bus (e.g., corresponding to Out node in FIG. 1), need to have a column-level signal readout path to be fast enough to sample the FD voltage levels at very short time intervals. Moreover, to have better low-light performance, it is better to have a gain stage (or programmable gain amplifier) to be connected to a column or cluster bus to amplify the weak signal before it will be sent to other readout units, such as analog-to-digital converter (ADC), buffers, sample-and-holds, etc.

Figure 9:
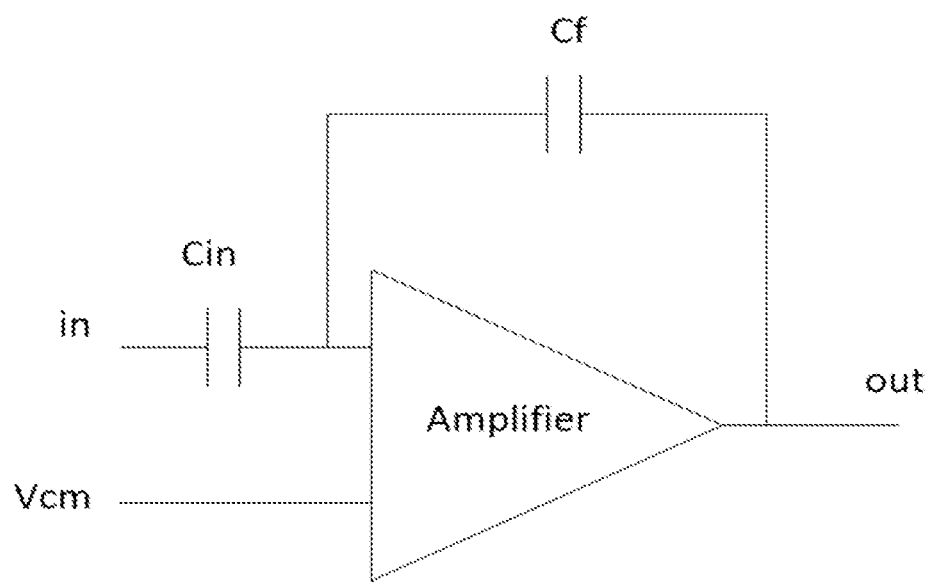
FIG. 9 is a simplified illustration of one known approach to implement an accurate gain stage.
Figure 10:
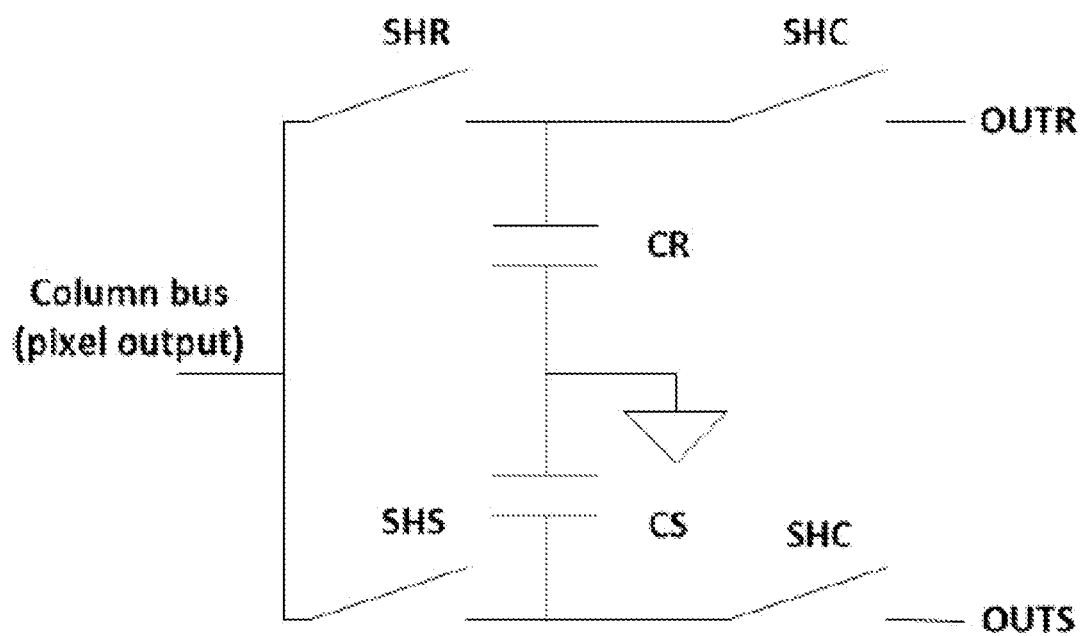
FIG. 10 is a simplified illustration of a known approach to implement a passive CDS unit.

FIG. 9 is a simplified illustration of one known approach to implement an accurate gain stage; namely, by using a continuous-time amplifier and a capacitor feedback network to provide a gain of Cin/Cf (the circuit depicted being a single-ended gain amplifier). Cin and Cf are normally chosen to be relatively large to provide better gain-variation performance from one gain stage to the other. But having a large Cin limits the speed (sampling rate) of the gain stages. In some cases, two or more capacitors are used as a passive CDS unit, such as shown in FIG. 10. To reduce the noise (mostly thermal noise), these capacitors (CR and CS) are normally large; therefore, the settling time of the signal on the column is increased and overall readout speed is reduced.

Figure 11A:
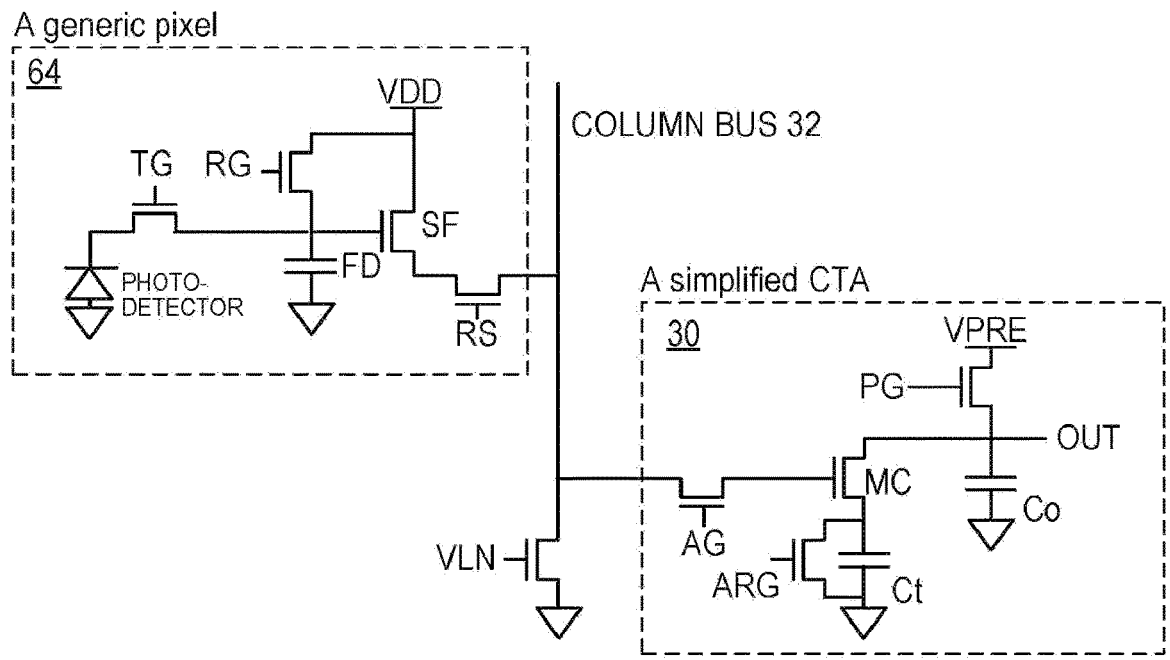
FIG. 11A schematically depicts an illustrative embodiment of a simplified single-ended charge-transfer amplifier (CTA) that may be implemented as the gain stage in the column-level readout chain to provide for fast CDS readout of a pixel, in accordance with some embodiments.

FIG. 11A schematically depicts an illustrative embodiment of a simplified single-ended charge-transfer amplifier (CTA) 30 that may be implemented as the gain stage in the column-level readout chain to provide for fast CDS readout of a pixel 64 (which is depicted as a generic 4T pixel, but may, in some embodiments be implemented to, e.g., include an isolated FD structure in accordance with embodiments according to the present disclosure). Gain of the CTA is proportional to −Ct/Co.

Operation of the CTA during readout of a pixel may be understood as follows with reference to the timing diagram/operating waveform shown in FIG. 11B. In a row-time, first the FD and Ct are reset by turning on RG and ARG switches. Right before turning on the TG switch, the PG and AG switches are turned on and the reset voltage level on FD (after being buffered by SF and reduced by the Vgs of SF transistor) will be applied to the gate of MC. Ct will be precharged to the reset voltage on column minus threshold voltage of MC. Co will be precharged to voltage level VPRE. After the charge transfer from the photodetector to the FD, the AG switch is turned on and if the signal level at the input of the CTA (gate of MC) on column is changed by ΔV, since the gate-source voltage of MC is reduced by ΔV, some charges which is equivalent to (ΔV)(Ct) is transferred to Co from Ct and provides a gain which is equal to −Ct/Co. Note that the structure of CTA shown in FIG. 11 is simplified and any kind of CTA such as, CMOS and fully differential CMOS structures can be used.

Figure 11B:
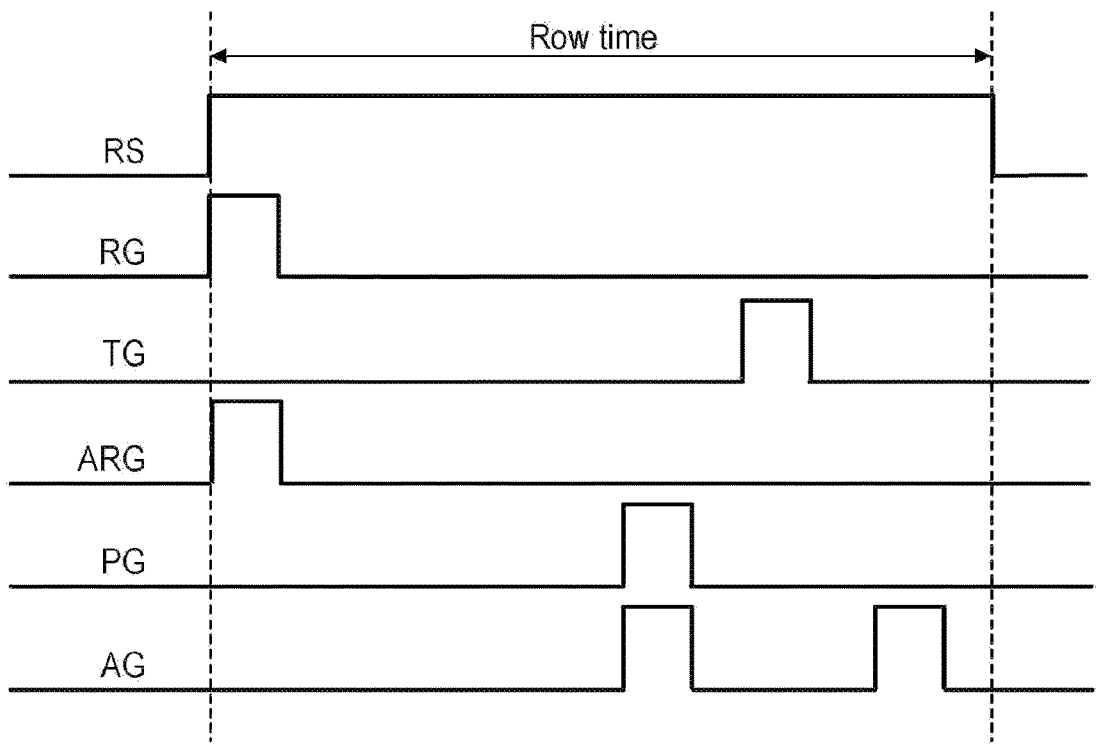
FIG. 11B depicts an illustrative timing diagram for operating the CTA of FIG. 11A, in accordance with some embodiments.
Figure 12:
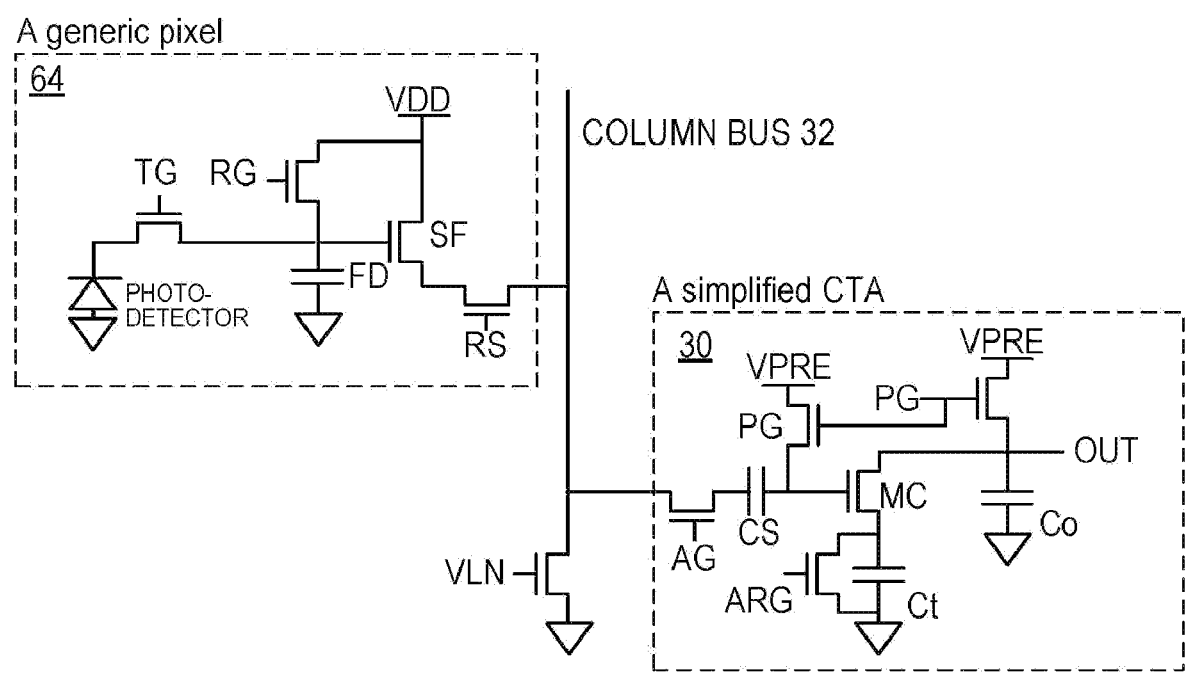
FIG. 12 schematically depicts an illustrative embodiment of a simplified CTA that may be implemented as the gain stage in the column-level readout chain to provide for fast CDS readout of a pixel, in accordance with some embodiments.

As will be understood in view of the illustrative embodiment depicted in FIG. 11A as may be operated in accordance with the timing diagram of FIG. 11B, a column-level CTA in accordance with various embodiments of the present disclosure eliminates the requirement for having a conventional passive correlated-double sampling unit in the column-level readout chain, as the Ct capacitor inside the CTA tracks the difference between the reset value and the transfer value (signal plus reset) of the pixel and amplifies the difference. Since the MC transistor separates Ct from the column, regardless of how large the Ct capacitance is designed, the in-pixel SF does not drive Ct; therefore, the bandwidth of the in-pixel amplifier (e.g., source-follower amplifier) can be increased and high-speed sampling is reachable. In some applications, the CTA DC input voltage level should be isolated from the pixel output DC voltage level. In this case, a sampling capacitor (CS) may be added between the input of the CTA and AG switch, as shown in the illustrative embodiment of FIG. 12, which may be operated in accordance with the timing diagram shown in FIG. 11B.

As noted, a benefit of this illustrative readout structure is that no passive CDS unit (such as shown in FIG. 10) is required. The CDS process and amplification are performed in the CTA at once. In other words, in, for example, the embodiment of FIGS. 11A and 12, while the ratio of Ct/Co provides gain, the difference between the reset and transfer voltage values on the column is sensed by the CTA and is amplified by the gain of the CTA. In view of the present disclosure, however, it will be understood that similar integrated performance of both CDS and amplification may be provided by various alternative embodiments employing different types of CTAs (e.g., CMOS CTAs and fully differential CMOS CTAs).

In view of the present disclosure, it will also be understood that a further benefit of an image sensor having a CTA readout structure directly or capacitively coupled to the column bus and configured to perform both CDS and amplification during pixel readout is its reduced capacitance (e.g., compared to using a separate CDS unit (such as the passive unit of FIG. 10) coupled to the column bus and/or compared to using a separate gain stage such as the continuous-time amplifier of FIG. 9). This reduced capacitance of the CTA reduces the capacitance on the column bus and allows for high speed sampling.

And even in some alternative embodiments in which the CTA unit may be implemented after a separate gain stage that is coupled to the column bus, the reduced input capacitance of the CTA unit reduces the capacitance on the output of the gain stage, thus providing for increased bandwidth of the column-level readout chain (e.g., compared to having a higher input capacitance component coupled to the output of the gain stage).

In view of the present disclosure, it will also be understood that a further benefit of CTA embodiments employing a common capacitor for sampling both the reset level and the transfer/signal level is the reduction of the kTC noise associated with such sampling compared to using separate capacitors for sampling the reset and transfer/signal levels.

Figure 13A:
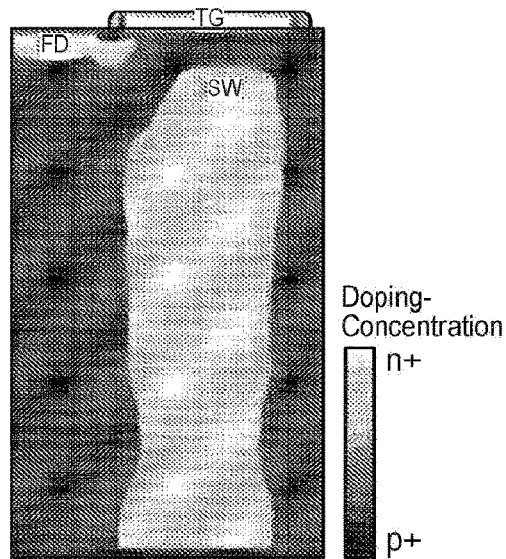
FIGS. 13A and 13B depict a TCAD simulation of a vertical storage well pixel having an isolated FD, in accordance with some embodiments.
Figure 13B:
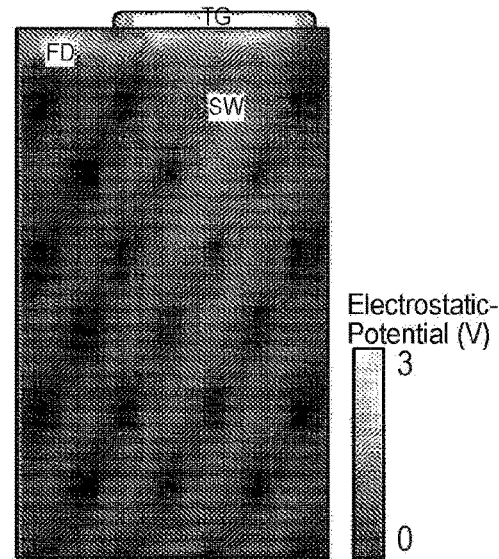
Figure 14:
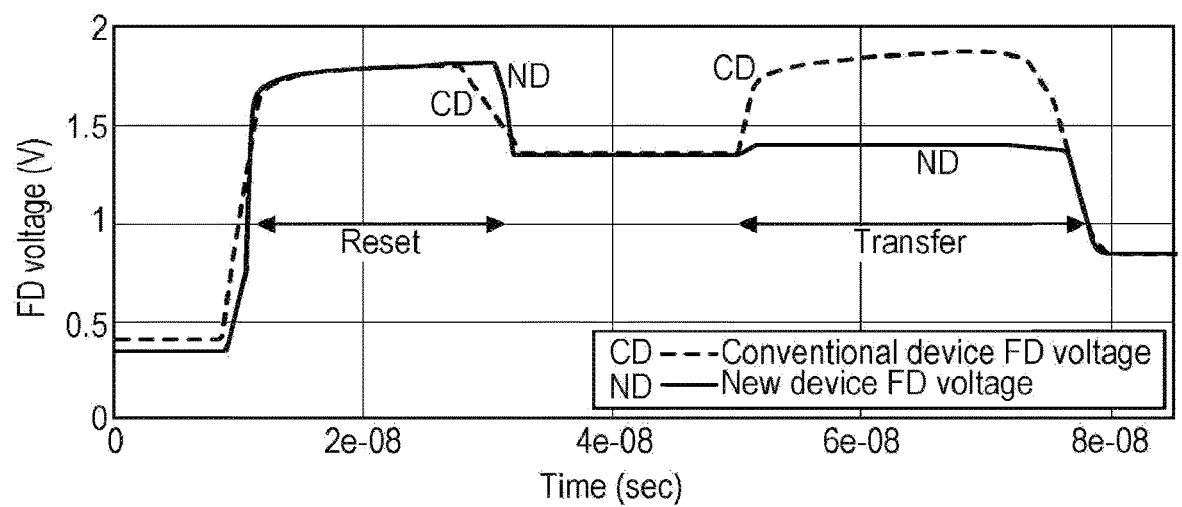
FIG. 14 shows the floating diffusion voltage versus time from the TCAD simulation corresponding to FIGS. 13A and 13B, in accordance with some embodiments.

FIGS. 13A, 13B, 14, and 15B depict TCAD simulation results for a vertical storage well pixel having an isolated FD according to a non-limiting illustrative embodiment of the present disclosure. More specifically, FIG. 13A depicts a cross-section doping concentration profile, and FIG. 13B depicts a cross-section electrostatic potential profile when TG is biased to 3V, for this illustrative embodiment (the "new device, ND," for ease of reference). FIG. 14 shows the FD voltage versus time from TCAD simulation, comparing the new device ND (having an isolated FD) to a conventional device (CD) (i.e., not having an isolated FD, but otherwise having the same design as the new device). As can be seen, the TG feedthrough is significantly reduced in the new device.

Figure 15A:
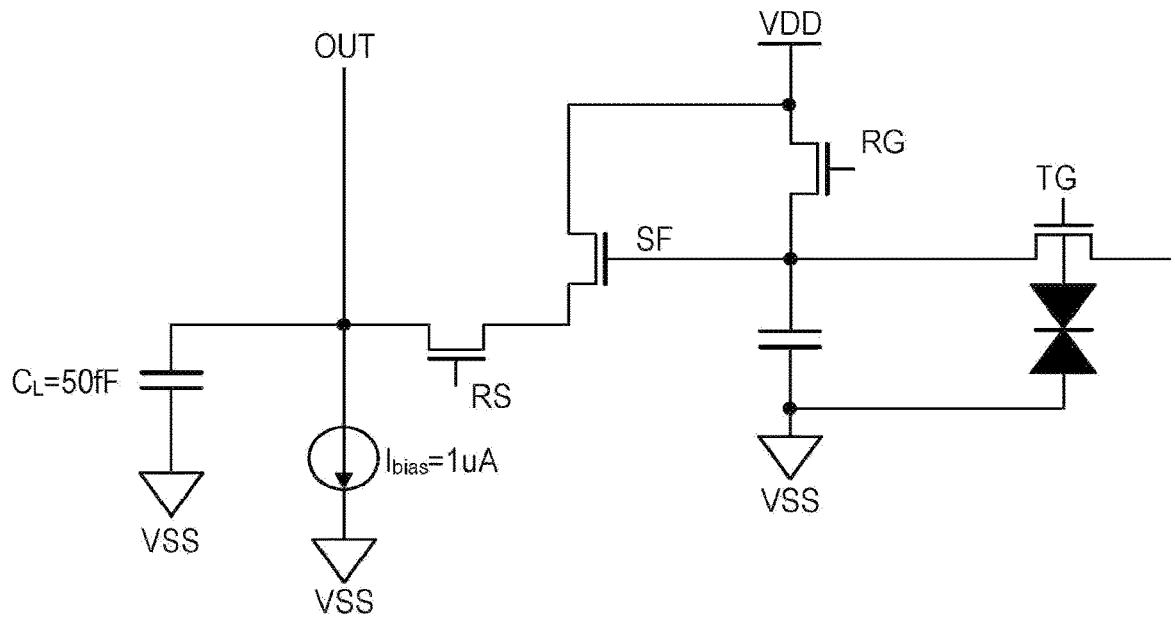
FIG. 15A shows an equivalent circuit schematic corresponding to a TCAD simulation, in accordance with some embodiments.
Figure 15B:
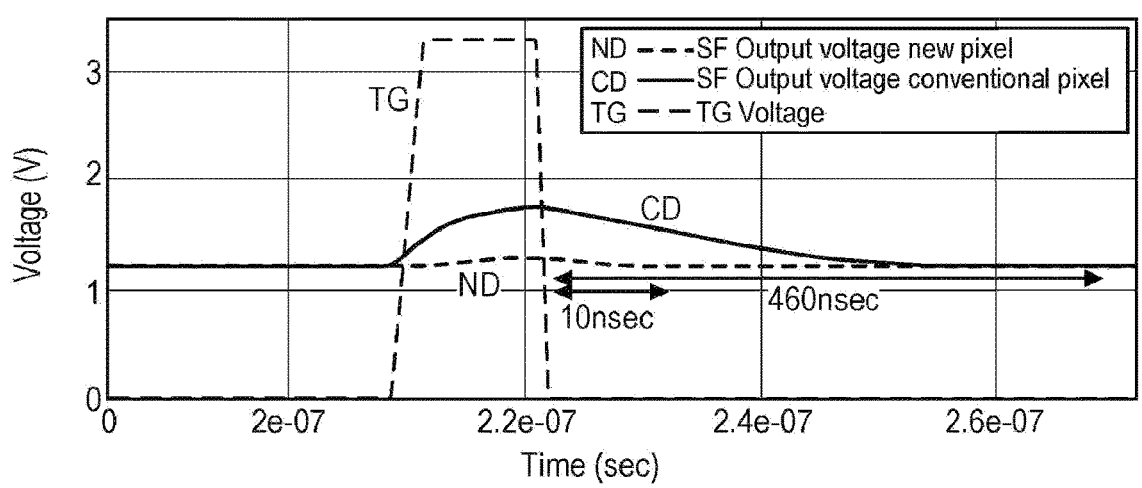
FIG. 15B shows the column output signal (OUT) versus time for the TCAD simulation corresponding to the equivalent circuit schematic shown in FIG. 15A, in accordance with some embodiments.

FIG. 15A shows an equivalent circuit schematic corresponding to a TCAD simulation comparing the new device (ND) to the conventional device (CD), wherein FIG. 15B shows the column output signal (OUT) versus time for the TCAD simulation. As shown in the circuit schematic, the simulation was conducted with 50 fF load capacitance and 1 μA bias current. As can be seen, the TG signal settling time is reduced from 460 nsec for the conventional device to 10 nsec for the new device.

In view of the present disclosure, it may also be understood that various advantages associated with isolating the floating diffusion region from the transfer gate may similarly be provided by isolating the floating diffusion region from the reset gate. In accordance with some embodiments, as an alternative or an addition to implementing a pinned transfer gate, a pinned reset gate may be implemented such that a doped pinning region is included within the floating diffusion of the pixel to reduce or eliminate the effective capacitive coupling between the floating diffusion and a reset gate that is configured to control the potential between the floating diffusion and a drain region so as to control charge transfer from the floating diffusion to the drain region along charge transfer path and thereby selectively reset the potential of the floating diffusion. In some embodiments, the doped pinning region is disposed adjacent to, and may be overlapped by, an edge of the reset gate stack, so as to effectively pin the potential at a surface region of the semiconductor at one end of the reset gate such that the charge transfer path having a potential controlled by the reset gate is disposed away from the surface region, thereby providing the pinned reset gate.

Figure 16A:
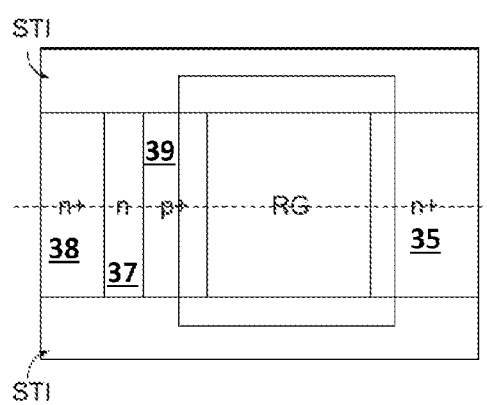
FIGS. 16A and 16B schematically depict a plan view and a cross-sectional view, respectively, of a reset transistor portion of an illustrative pixel that has a FD isolated from the reset gate RG, in accordance with some embodiments.
Figure 16B:
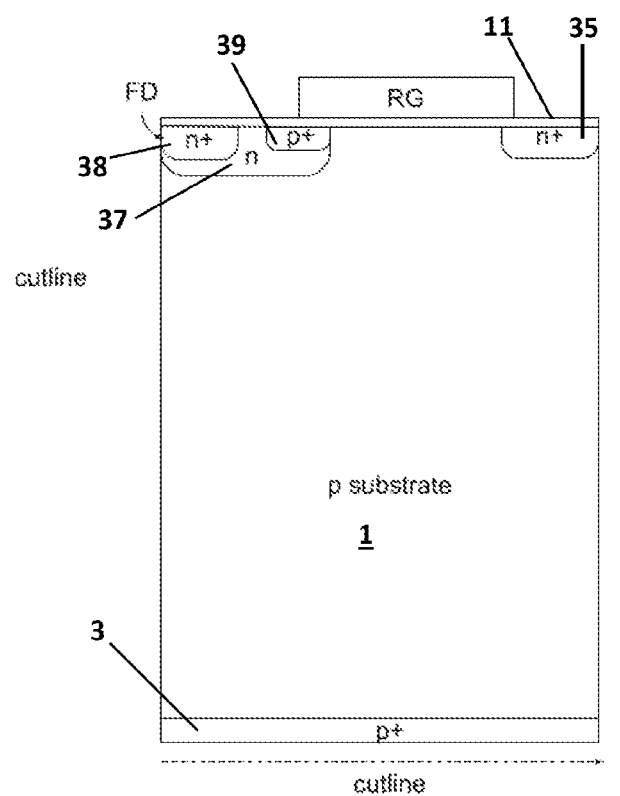

In accordance with some embodiments, FIGS. 16A and 16B depict a plan view and a cross-sectional view, respectively, of a reset transistor portion of an illustrative pixel that has a FD isolated from the reset gate RG, which may be similarly viewed as having a pinned reset gate. As shown, shallow trench isolation (STI) regions define the lateral extent of the reset transistor, which includes a drain region 35 (which would be coupled to a pixel supply voltage, such as VDD in FIG. 1), and a gate stack comprising reset gate RG overlying gate insulator 11, and is configured to reset the potential of the FD potential to near the pixel supply voltage upon pulsing RG. The floating diffusion FD comprises FD n+ charge storage region 38 and FD n-type extension layer 37, wherein the FD is isolated from reset gate (RG) feed-through voltage by intervening p+ pinning layer 39, which in this embodiment is shown as disposed with the FD and forming a p+/n junction with the FD n-type extension layer 37 thereof.

Accordingly, in accordance with some embodiments, a CMOS image sensor pixel may comprise a pinned reset gate and a buried charge transfer path to (1) reduce the overlap parasitic capacitance between the reset gate and floating diffusion for high conversion gain; and (2) reduce the voltage feed through on the floating diffusion caused by reset gate signal pulses for fast correlated double sampling and low-noise readout.

Figure 17:
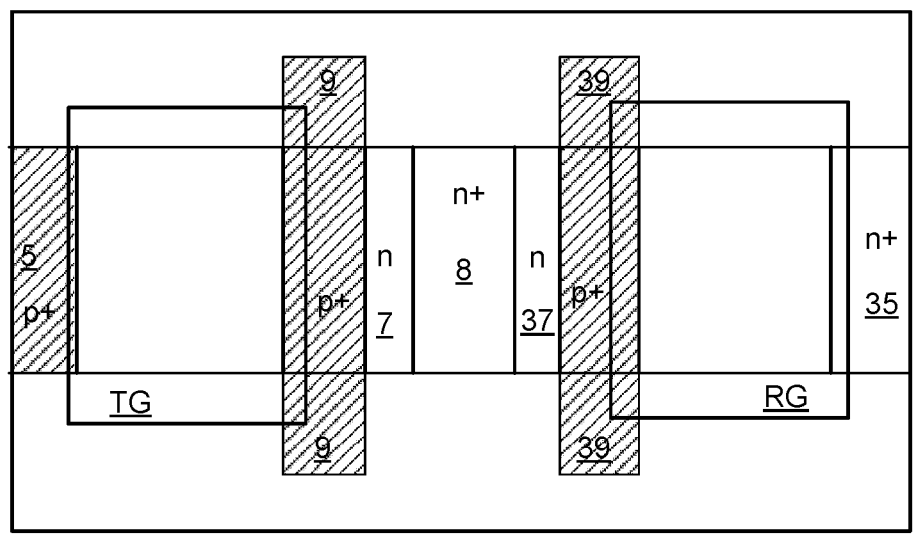
FIG. 17 schematically depicts a plan views of a portion of PPD pixel wherein the FD is isolated from both the reset gate (RG) and the transfer gate (TG), in accordance with some embodiments.
Figure 18:
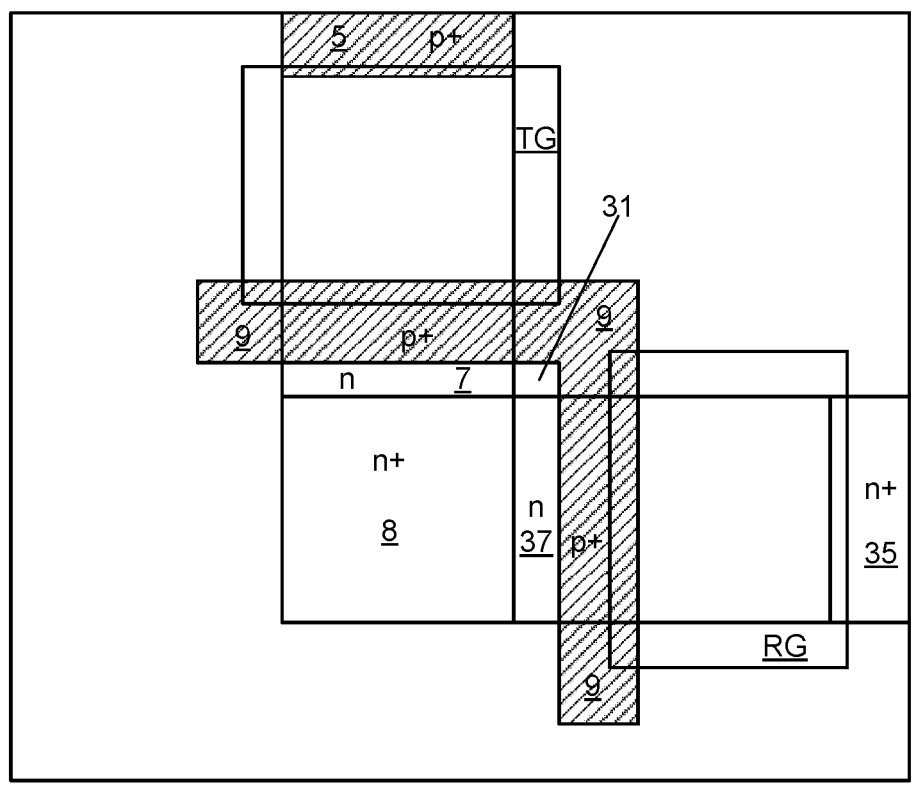
FIG. 18 schematically depicts a plan views of a portion of PPD pixel wherein the FD is isolated from both the reset gate (RG) and the transfer gate (TG), in accordance with some embodiments.

It will be understood in view of the present disclosure that in some embodiments that implement both a pinned transfer gate (that is, the FD is isolated from the TG) and a pinned reset gate (that is, the FD is isolated from the RG), the pinned transfer gate and the pinned reset gate may be configured with respective doped pinning region portions formed within the floating diffusion such as schematically depicted in the illustrative embodiment of FIG. 17, or alternatively may be configured with a common doped pinning region portion (i.e., used for both the pinned transfer gate and the pinned reset gate) formed within the floating diffusion such as depicted in the illustrative embodiment of FIG. 18. It will be understood that while in FIG. 17 n-type extension regions 7 an 37 are separate (i.e., they do not merge under n+ floating diffusion region 8), in alternative embodiments they may be contiguous (e.g., one common n-type extension region well extending from the TG edge to the RG edge, under FD region 8, and pinning regions 9 and 39. Similarly, it will be understood that while in FIG. 18 n-type extension regions 7 an 37 are separate (e.g., they do not extend into region 31), in alternative embodiments they may be contiguous (e.g., they extend into region 31).

Figure 19:
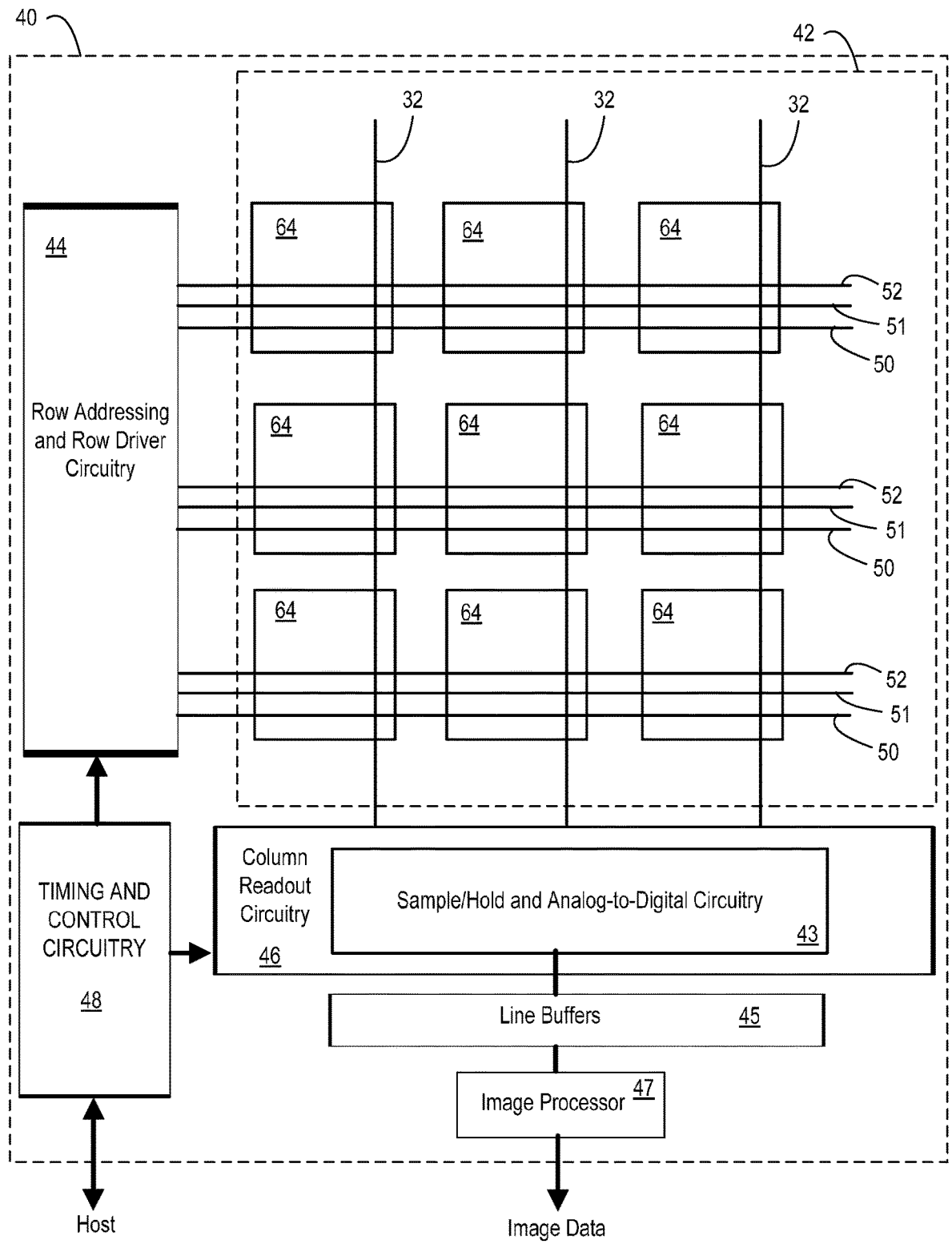
FIG. 19 schematically depicts a block diagram of an illustrative CMOS image sensor architecture that may be used to implement various embodiments in accordance with the present disclosure.

FIG. 19 depicts a block diagram of an illustrative CMOS image sensor 40 architecture that may be used to implement embodiments in accordance with the present disclosure, such as embodiments comprising pixels that employ an isolated FD (e.g., for the TG and/or the RG, in accordance with those described hereinabove in connection with FIGS. 4A, 4B, 5A, 5B, 6, 7A, 7B, 8, 16A, 16B, 17, and 18) and/or embodiments comprising a column-level readout chain implemented with a CTA to provide both CDS and amplification (e.g., in accordance with those described herein-above in connection with FIGS. 11A, 11B, 12, 13A, 13B, 14, 15A, and 15B). As well known, pixel array 42 typically includes a large number of pixels arranged in an M×N array; however, CMOS image sensor 40 is shown as including a simplified pixel array 42 comprising a three by three array of pixels 64, which, for ease of discussion, is a pixel circuit in accordance with any of the foregoing embodiments, but may be any of a variety of pixel circuit types that are configured to implement a isolated FDs and/or column-level readout chains in accordance with embodiments of the present disclosure. And, for example, in some embodiments, the pixels may be shared pixels (e.g., sharing a FD and RD and possibly additional readout circuitry) and may further be configured for in pixel binning.

Row Addressing and Row Driver Circuitry 44 generates transfer gate (TG) control signals on lines 51, row select (RS) signals on lines 55, and reset drain (RD) control signals on lines 52. In some embodiments, Column Readout Circuitry 46 may be configured to implement CTAs providing both CDS and amplification (e.g., in accordance with those described hereinabove in connection with FIGS. 11A, 11B, 12, 13A, 13B, 14, 15A, and 15B), and may include analog-to-digital circuitry 43 for sampling and/or digitizing output values readout from the pixel array 42. Particularly, circuitry 43 may be implemented to comprise a plurality of A/D converters configured to implement column parallel readout. In some embodiments, the circuitry 43 may be configured such that the readout circuitry associated with each column bus 32 may have a respective analog to digital converter (ADC), though in some embodiments pairs of columns may share an ADC Timing and control circuitry 48 controls both the row addressing and row driver circuitry 44 and the column readout circuitry 43. For instance, timing and control circuitry controls the row addressing and row driver circuitry 44 for selecting the appropriate row for readout, and may, for example, provide timing control signals in accordance with rolling shutter readout or global shutter readout. As indicated in FIG. 19, timing and control circuitry 48 may also communicably interface with a host (e.g., a processor associated with a system comprising the image sensor), which may, for example, in some implementations, specify various control information.

As schematically depicted, signals on column buses 32 are sampled and digitized by circuitry 43, and the digitized pixel values provided by the ADCs may be provided to line buffers 45, which may be used to temporarily store digital signals from circuitry 43 for use by image processor 47. In general, any number of line buffers 45 may be included and, for example, each line buffer may be capable of storing digital signals representative of the charge signals that may be read from each pixel in a given row of pixels in the pixel array 42. Image processor 47 may be used to process the digital signals held in line buffers 36 to produce output image data that may be provided to a device external to the image sensor 40.

As may be appreciated, there are many possible alternative implementations of an image sensor architecture that may embody (i) pixels having a isolated FDs and/or (ii) a column-level readout chain implemented with a CTA to provide both CDS and amplification in accordance with some embodiments of the present disclosure.

As may be appreciated in view of the foregoing disclosure, various embodiments according to the present disclosure provide many features and advantages. For example, pixels having an isolated FD according to some embodiments provide for at least the following benefits and advantages:

Significantly reduced TG feed-through voltage for fast CDS operation

Lower SF noise with shorter CDS time

Higher conversion gain with reduced TG-FD overlap capacitance

High-speed operation with shorter sampling time

It will also be understood that a column-level readout chain implemented with a CTA to provide both CDS and amplification in accordance with various embodiments according to the present disclosure provide for at least the following benefits and advantages:

No need of conventional CDS unit and large capacitors in the CDS unit

Reduction of kTC noise from the sampling on the single capacitor

CDS and amplification are done at the same time in the same unit (CTA)

High-speed readout with shorter settling time on the column bus, because of capacitance reduction on the column bus Although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. A semiconductor image sensor, comprising:
a plurality of pixels, each comprising:
a storage well to accumulate photocharge in response to light exposure;
a floating diffusion region having (i) a first doping region of a first dopant type at a first depth in a vertical direction, (ii) a second doping region of the first dopant type formed, at a second depth less than the first depth, within the first doping region, and (iii) a third doping region of a second dopant type formed, at a third depth less than the first depth, at least partially within the first doping region and not within the second doping region;
a transfer gate having a portion overlying, in the vertical direction, a first portion of the third doping region;
a reset gate having a portion overlying, in the vertical direction, a second portion of the third doping region, wherein the third doping region is contiguous in a horizontal direction between the transfer gate and the reset gate; and
a charge transfer path between the storage well and the floating diffusion region.

2. The semiconductor image sensor of claim 1, wherein the first dopant type is n-type dopant, and the second dopant type is p-type dopant.

3. The semiconductor image sensor of claim 1, wherein the transfer gate is adjacent to the charge transfer path to control transfer of the photocharge from the storage well to the floating diffusion region through the charge transfer path.

4. The semiconductor image sensor of claim 1, further comprising:
an output line; and
an amplifier circuit, comprising:
a first transistor coupled to the output line, which is selectively switched to (i) charge a first capacitor to a first voltage level and (ii) conduct charge from the first capacitor to a second capacitor to produce a voltage change on the second capacitor representative of the photocharge accumulated during the light exposure.

5. The semiconductor image sensor of claim 4, wherein the amplifier circuit comprises a second transistor switch coupled between the first transistor and the output line.

6. The semiconductor image sensor of claim 5, wherein the amplifier circuit comprises a capacitor coupled between the second transistor switch and the output line.

7. The semiconductor image sensor of claim 4, wherein the amplifier circuit comprises a third transistor switch coupled in parallel with the first capacitor.

8. The semiconductor image sensor of claim 4, wherein the amplifier circuit comprises a fourth transistor switch coupled in series with the second capacitor to a reference voltage.

9. The semiconductor image sensor of claim 1, wherein at least some portion of the second doping region does not underly the third doping region in the vertical direction.

10. The semiconductor image sensor of claim 1, wherein the first portion of the third doping region is connected to the second portion of the third doping region at an angle in the horizontal direction to form the contiguous third doping region.

11. A method of operation within a semiconductor image sensor, comprising:
accumulating, using a storage well of a pixel, photocharge in the storage well of in response to light exposure;
transferring the photocharge from the storage well to a floating diffusion region through the charge transfer path by turning on a transfer gate, wherein the floating diffusion region comprises (i) a first doping region of a first dopant type at a first depth in a vertical direction, (ii) a second doping region of the first dopant type formed, at a second depth less than the first depth, within the first doping region, and (iii) a third doping region of a second dopant type formed, at a third depth less than the first depth, at least partially within the first doping region and not within the second doping region, and wherein the transfer gate has a portion positioned above a first portion of the third doping region in the vertical direction, the first portion having a length in a horizontal direction longer than a length of the transfer gate in the horizontal direction;

generating, at the floating diffusion region of the pixel, a voltage in response to transfer of the photocharge from the storage well to the floating diffusion region through the charge transfer path; and resetting the floating diffusion region of the pixel by pulsing a reset gate having a portion positioned above a second portion of the third doping region in the vertical direction, the second portion having a length in the horizontal direction longer than a length of the reset gate in the horizontal direction.

12. The method of claim 11, wherein the charge transfer path is of the second dopant type.

13. The method of claim 11, wherein the first dopant type is n-type dopant, and the second dopant type is p-type dopant.

14. The method of claim 11, wherein the semiconductor image sensor comprises an output line and an amplifier circuit, wherein the amplifier circuit comprises a first transistor switch coupled to the output line, wherein the method comprises:

charging, using the first transistor switch, a first capacitor to a first voltage level; and conducting, using the first transistor switch, charge from the first capacitor to a second capacitor to produce a voltage change on the second capacitor representative of the photocharge accumulated during the light exposure.

15. The method of claim 14, wherein the amplifier circuit comprises a second transistor switch coupled between the first transistor switch and the output line.

16. The method of claim 15, wherein the amplifier circuit comprises a capacitor coupled between the second transistor switch and the output line.

17. The method of claim 14, wherein the amplifier circuit comprises a third transistor switch coupled in parallel with the first capacitor.

18. The method of claim 14, wherein the amplifier circuit comprises a fourth transistor switch coupled in series with the second capacitor to a reference voltage.

19. The method of claim 14, comprising:

determining, using circuitry, a digital signal representative of the voltage change on the second capacitor.

20. A semiconductor image sensor, comprising:

a plurality of pixels, each comprising:

a storage well to accumulate photocharge in response to light exposure;

a floating diffusion region having (i) a first doping region of a first dopant type at a first depth in a vertical direction, (ii) a second doping region of the first dopant type formed, at a second depth less than the first depth, within the first doping region, and (iii) a third doping region of a second dopant type formed, at a third depth less than the first depth, at least partially within the first doping region and not within the second doping region;

a transfer gate having a portion overlying, in the vertical direction, a first portion of the third doping region;

a reset gate having a portion overlying, in the vertical direction, a second portion of the third doping region, wherein a first portion of the first doping region is adjacent the first portion of the third doping region in a horizontal direction and a second portion of the first doping region is adjacent the second portion of the third doping region in the horizontal direction, and wherein the second doping region is between the first and second portions of the first doping region in the horizontal direction; and a charge transfer path between the storage well and the floating diffusion region.

\* \* \* \* \*